(12) United States Patent
Liu

(10) Patent No.: US 11,259,442 B2
(45) Date of Patent: Feb. 22, 2022

(54) ADJUSTMENT STRUCTURE FOR COMPUTER WATER COOLING

(71) Applicant: AMERICAN FUTURE TECHNOLOGY, City of Industry, CA (US)

(72) Inventor: You-Chi Liu, City of Industry, CA (US)

(73) Assignee: American Future Technology, City of Industry, CA (US)

(*) Notice: Subject to any disclaimer, the term of this patent is extended or adjusted under 35 U.S.C. 154(b) by 0 days.

(21) Appl. No.: 17/091,747

(22) Filed: Nov. 6, 2020

(65) Prior Publication Data
US 2021/0267092 A1 Aug. 26, 2021

(30) Foreign Application Priority Data
Feb. 24, 2020 (TW) .................................. 109105894

(51) Int. Cl.
*H05K 7/20* (2006.01)
*G06F 1/20* (2006.01)

(52) U.S. Cl.
CPC .......... *H05K 7/20327* (2013.01); *G06F 1/20* (2013.01); *H05K 7/20781* (2013.01)

(58) Field of Classification Search
CPC .. G06F 1/20; H05K 7/20327; H05K 7/20772; H05K 7/20781; H05K 7/20809; H05K 7/20818
See application file for complete search history.

(56) References Cited

U.S. PATENT DOCUMENTS

| 2003/0201095 A1* | 10/2003 | Liu ....................... H01L 23/473 165/164 |
| 2007/0285899 A1* | 12/2007 | Cheng ...................... G06F 1/20 361/718 |
| 2007/0289719 A1* | 12/2007 | Chu ...................... H01L 23/473 165/80.4 |
| 2009/0218072 A1* | 9/2009 | Eriksen ................... G06F 1/206 165/80.2 |
| 2009/0290299 A1* | 11/2009 | Lin .......................... G06F 1/20 361/679.47 |
| 2010/0326628 A1* | 12/2010 | Campbell ............... F28D 15/02 165/104.21 |
| 2012/0300398 A1* | 11/2012 | Eckberg ............. H05K 7/20718 361/692 |
| 2013/0138253 A1* | 5/2013 | Chainer ............. H05K 7/20281 700/282 |

(Continued)

*Primary Examiner* — Jacob R Crum
(74) *Attorney, Agent, or Firm* — Muncy, Geissler, Olds & Lowe, P.C.

(57) ABSTRACT

An adjustment structure for computer water cooling includes a water-cooling head attached to a heating element of a circuit board, a water-cooling head adapter attached to the water-cooling head and provided with two water inlet and outlet connectors, and a steering adapter with two hard water pipes extended from one lateral side thereof and connected to a water cooling row connector of a water cooling row and two flexible water pipes extended from a bottom side thereof and respectively connected to the water inlet and outlet connectors of the water-cooling head adapter. The two flexible water pipes form an adjustment structure that flexibly fits the steering adapter and the two water inlet and outlet connectors.

7 Claims, 3 Drawing Sheets

(56) References Cited

U.S. PATENT DOCUMENTS

2016/0120065 A1\* 4/2016 Shedd ................... F25B 41/40
 165/104.29
2018/0299931 A1\* 10/2018 Li ............................ G06F 1/20
2019/0223323 A1\* 7/2019 Wu .......................... H05K 7/20
2019/0327856 A1\* 10/2019 Lan ................... H05K 7/20763

\* cited by examiner

ADJUSTMENT STRUCTURE FOR COMPUTER WATER COOLING

This application claims the priority benefit of Taiwan patent application number 109105894, filed on Feb. 24, 2020.

BACKGROUND OF THE INVENTION

1. Field of the Invention

The present invention relates to water cooling technology and more particularly, to an adjustment structure for computer water cooling, which uses an adjustment structure formed of two flexible water pipes to solve the problem of the prior art design of water cooling mechanism that cannot fit different computer mainframes because the position of the hard water pipes connected between the water-cooling head adapter and the water cooling row connector may be different due to that the relative position of the central processing unit (CPU) of different motherboards is slightly different.

2. Description of the Related Art

With the rapid development of electronic technology and network technology, whether it is a personal computer or a computer server has become an indispensable part of people's daily life. At the same time, with the rise of the e-sports industry, the performance of computers used in e-sports must also match the demand for online games where every second counts. The increase in computer performance is also accompanied by the increase in the heat generated by the internal components of the computer, which has a serious impact on the performance and service life of the computer. Therefore, a good heat dissipation device must be provided to cool the computer components to ensure the smooth operation of the computer.

The cooling method of the computer is roughly divided into air cooling system and water cooling system. The air-cooling method uses multiple fans to suck in cold air from the outside of the computer into the computer. The gas flow channel is designed to dissipate heat-prone components (such as: central processing units, graphics processing units, access devices, interface cards and power components), and then hot air that has risen in temperature is also exhausted from the computer by a fan to complete air cooling and heat dissipation. The air cooling system has the advantages of simple structure and lower cost, but its disadvantage is that the heat dissipation effect is relatively general and it is easy to accumulate a lot of dust inside the computer. In contrast, the water cooling system has the advantage of heat dissipation. The method is to install a water-cooling head on the heating element. The water-cooling head is equipped with radiating fins and a water-cooling fluid flow channel. The water-cooling fluid in the water-cooling head is used to absorb the heat of the heating element, and the water pump connected to the water-cooling head is used to pump the water-cooling fluid to flow into a hard water pipe. Then, the hard water pipe transports the water-cooled fluid with heat to a water cooling row with radiating fins and a fan for air cooling. The cooled water-cooling fluid is sent back to the water-cooling head by another hard water pipe to complete the heat dissipation of the water cooling cycle.

The above-mentioned water-cooling circulation cooling system has the advantage of high-efficiency heat dissipation, so it is widely used in the e-sports industry or other industries that require high-performance computers or servers. However, the size of the space for installing the water-cooling kit inside each computer is different, and the locking point provided by the computer for the water-cooling kit is not a fixed position. Therefore, when the water-cooling head is fixed on the heating element and the water cooling row is fixed on the computer case, the position of the hard water pipes connected between the water-cooling head adapter and the water cooling row connector may be different due to that the relative position of the central processing unit (CPU) of different motherboards is slightly different. Therefore, hard water pipes with fixed length and spacing have problems that cannot be smoothly connected. This problem needs to be solved by those engaged in this industry.

SUMMARY OF THE INVENTION

The present invention has been accomplished under the circumstances in view. It is therefore the main object of the present invention to provide an adjustment structure for computer water cooling, which comprises a computer mainframe with an accommodation space defined therein and a water cooling mechanism mounted in the accommodation space of the computer mainframe and filled with a water cooling fluid for carrying thermal energy. The water cooling mechanism comprises a water-cooling head having a bottom surface thereof attached to a top surface of a heating element of a circuit board, a water-cooling head adapter having a bottom side thereof attached to an opposing top surface of the water-cooling head and an opposing top side thereof provided with two water inlet and outlet connectors, and a steering adapter that comprises two hard water pipes extended from one lateral side thereof and connected to a water cooling row connector of a water cooling row and two flexible water pipes extended from a bottom side thereof and respectively connected to the water inlet and outlet connectors of the water-cooling head adapter. In this way, the two flexible water pipes form an adjustment structure that flexibly fits the steering adapter and the two water inlet and outlet connectors. With the aforementioned structure, the invention solves the problem of the prior art design of water cooling mechanism that cannot fit different computer mainframes because the position of the hard water pipes connected between the water-cooling head adapter and the water cooling row connector may be different due to that the relative position of the central processing unit (CPU) of different motherboards is slightly different.

Preferably, the flexible water pipes refer to transparent or opaque hollow water pipes made of soft rubber.

Preferably, the angle between the two hard water pipes and the two flexible water pipes of the steering adapter is between 60° and 120°.

Preferably, the heating element refers to the central processing unit, graphics processor, access device, interface card and power element.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
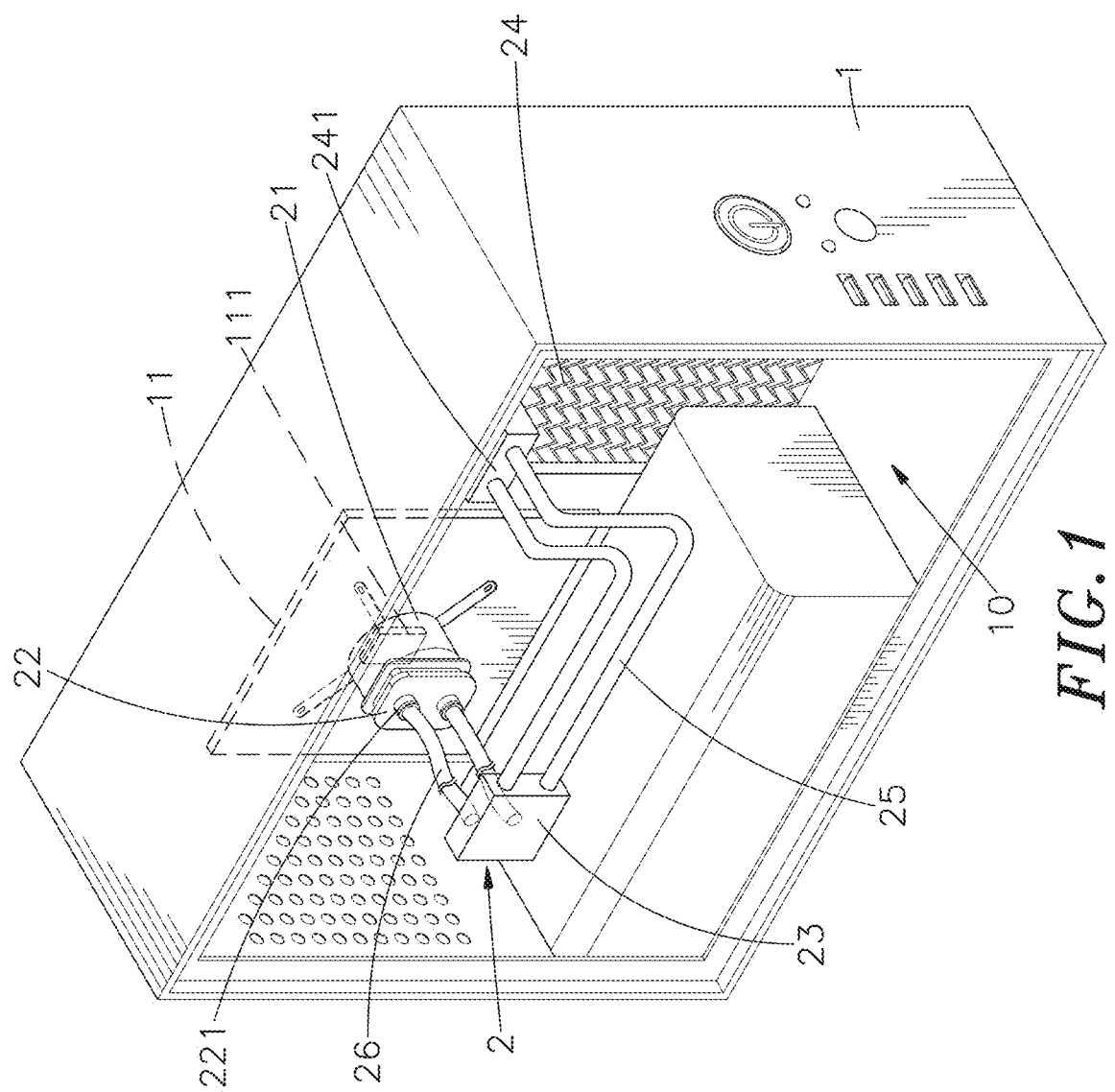
FIG. 1 is an oblique top elevational view of an adjustment structure for computer water cooling in accordance with the present invention.
Figure 2:
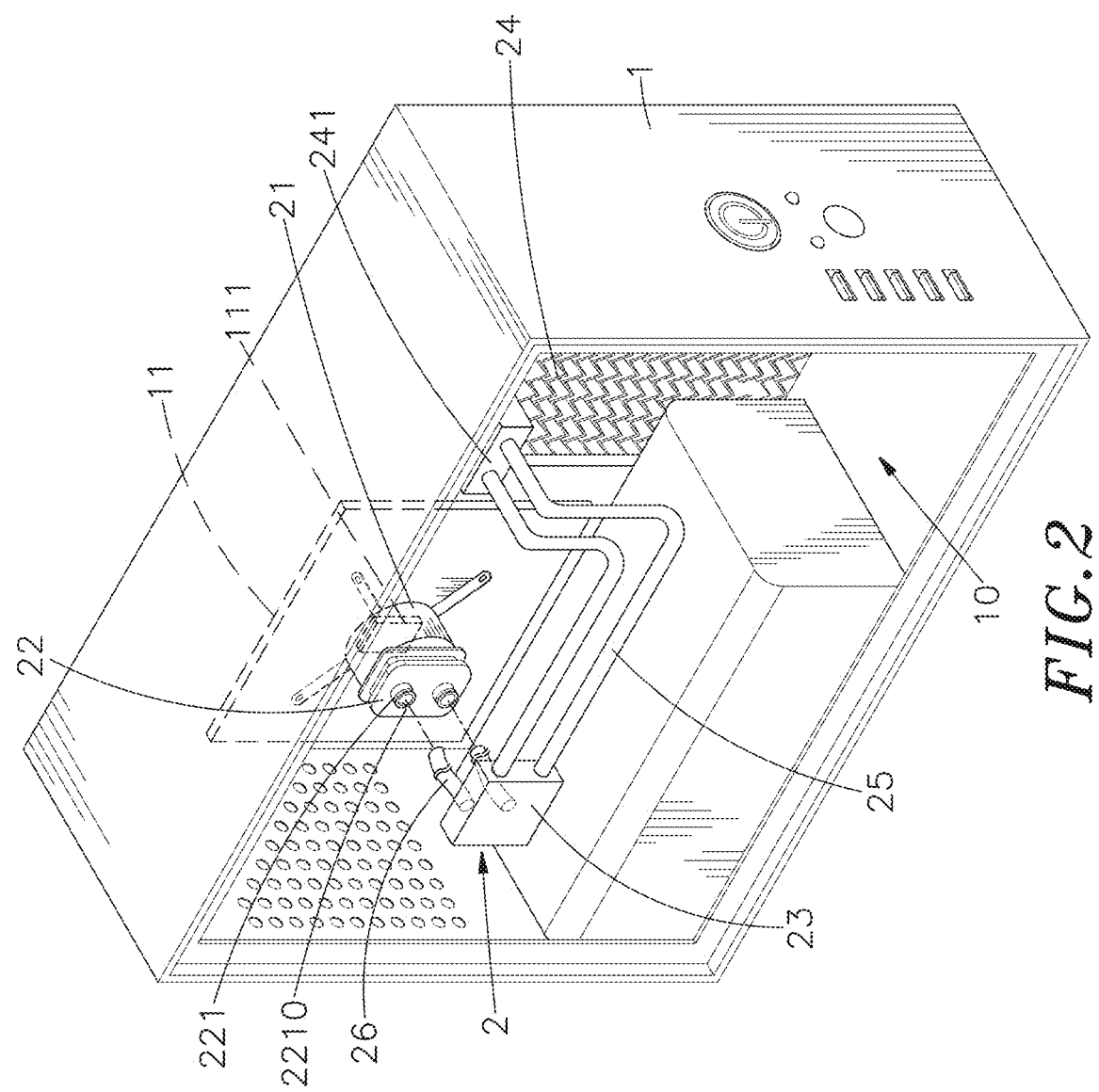
FIG. 2 is an exploded view of the adjustment structure for computer water cooling in accordance with the present invention.
Figure 3:
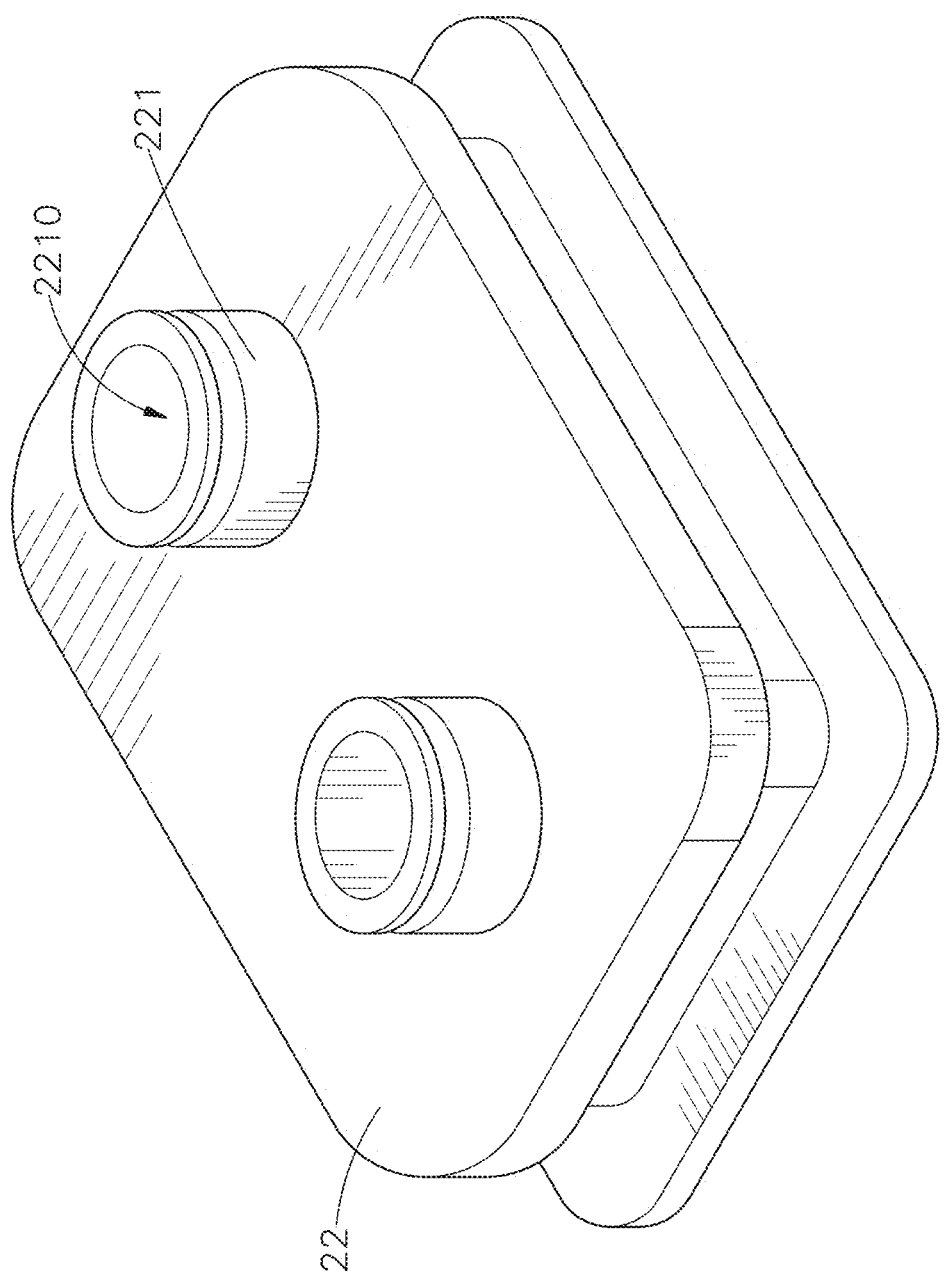
FIG. 3 is an elevational view of the water-cooling head adapter.

Referring to FIGS. 1-3, an oblique top elevational view of an adjustment structure for computer water cooling in accordance with the present invention, an exploded view of the adjustment structure for computer water cooling and an elevational view of the water-cooling head adapter of the adjustment structure for computer water cooling are shown. The adjustment structure for computer water cooling comprises a computer mainframe 1 and a water cooling mechanism 2. The water cooling mechanism 2 is mounted in an accommodation space 10 of the computer mainframe 1. The water cooling mechanism 2 is equipped with a water cooling fluid (not shown), which can carry thermal energy. The water cooling fluid refers to a water cooling fluid with anti-corrosion and antibacterial properties. The water cooling mechanism 2 comprises a water-cooling head 21, a water-cooling head adapter 22 and a steering adapter 23.

The water-cooling head 21 has a bottom surface thereof attached to a top surface of a heating element 111 of a circuit board 11. The heating element 111 refers to the central processing unit (CPU), graphics processing unit (GPU), access device (for example: DRAM, HDD or SSD, interface card (for example: video interface card or other heat-prone interface card) and power components (for example: applied to power components).

The water-cooling head adapter 22 has a bottom surface thereof attached to an opposing top surface of the water-cooling head 21, and an opposing top surface thereof provided with two water inlet and outlet connectors 221.

The steering adapter 23 has two hard water pipes 25 extended from one lateral side thereof and connected to a water cooling row connector 241 of a water cooling row 24, and two flexible water pipes 26 extended from a bottom side thereof and respectively connected to the two water inlet and outlet connectors 221 of the water-cooling head adapter 22. The connection structure of the flexible water pipes 26 and the water inlet and outlet connectors 221, whether it is to positioned the outer pipe wall of each of the flexible water pipes 26 on the side wall of a joining cavity 2210 inside the respective water inlet and outlet connector 221 or to attach the inner pipe wall of each of the flexible water pipes 26 onto the outer wall of the respective water inlet and outlet connector 221, all is in the protection scope of the present invention.

The two flexible water pipes 26 is an adjustment structure that flexibly fits the steering adapter 23 and the two water inlet and outlet connectors 221.

The angle between the two hard water pipes 25 and the two flexible water pipes 26 of the steering adapter 23 is between 60° and 120°. Although the angle between the two hard water pipes 25 and the two flexible water pipes 26 of the steering adapter 23 shown in the drawing is close to 90°, in order to meet the space utilization requirements in the accommodation space 10 of the computer mainframe 1, the angle range is set between 60° and 120°, which is reasonable configuration requirement.

The hard water pipes 25 refer to hollow water pipes made of glass or copper material. Of course, the present invention will not be limited to the aforesaid two materials. Any hard material water pipes with a hollow interior that can circulate water cooling fluid are within the protection scope of the present invention.

The flexible water pipes 26 refer to transparent or opaque hollow water pipes made of soft rubber. Of course, the present invention will not be limited to the aforesaid two materials. Any flexible material water pipes with a hollow interior that can circulate water cooling fluid are within the protection scope of the present invention.

The heat dissipation method of the adjustment structure for computer water cooling disclosed above is outlined hereinafter. The water-cooling head 21 is installed on the heating element 111. The water-cooling head 21 is equipped with radiating fins (not shown) and a water-cooling fluid flow channel (not shown). The water-cooling fluid in the water-cooling head 21 absorbs the heat of the heating element 111. The water pump (not shown) connected to the water-cooling head 21 pumps the water-cooling fluid to flow to the water-cooling head adapter 22. The water-cooling head adapter 22 transfers the water-cooling fluid to the steering adapter 23 through the flexible water pipe 26. The steering adapter 23 turns the water-cooling fluid to one of the hard water pipes 25. The hard water pipe 25 first transfers the water-cooling fluid with heat to the water cooling row connector 241, and then from the water cooling row connector 241 to the water cooling row 24 with radiating fins (not shown) and a fan (not shown) for air cooling. The cooled water-cooling fluid is sent back to the water-cooling head 21 through the other hard water pipe 25, the steering adapter 23, the flexible water pipes 26 and the water-cooling head adapter 22 to complete heat dissipation of the water-cooling cycle.

According to the disclosure in FIGS. 1-3, it can be understood that the present invention is an adjustment structure for computer water cooling, which comprises a computer mainframe with an accommodation space defined therein, and a water cooling mechanism mounted in the accommodation space of the computer mainframe and filled with a water cooling fluid for carrying thermal energy. The water cooling mechanism comprises a water-cooling head having a bottom surface thereof attached to a top surface of a heating element of a circuit board, a water-cooling head adapter having a bottom side thereof attached to an opposing top surface of the water-cooling head and an opposing top side thereof provided with two water inlet and outlet connectors, and a steering adapter having two hard water pipes extended from one lateral side thereof and connected to a water cooling row connector of a water cooling row and two flexible water pipes extended from a bottom side thereof and respectively connected to the water inlet and outlet connectors of the water-cooling head adapter. The two flexible water pipes form an adjustment structure that flexibly fits the steering adapter and the two water inlet and outlet connectors. With the aforementioned adjustment structure, the invention solves the problem of the prior art design of water cooling mechanism that cannot fit different computer mainframes because the position of the hard water pipes connected between the water-cooling head adapter and the water cooling row connector may be different due to that the relative position of the central processing unit (CPU) of different motherboards is slightly different. Therefore, the water cooling mechanism of the invention is applicable to a variety of computer mainframes. The solution provided by the present invention has excellent practicability in the field of solving the assembly of water cooling systems, so a patent application is filed to seek patent protection.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. An adjustment structure for computer water cooling, comprising a computer mainframe with an accommodation space defined therein and a water cooling mechanism mounted in said accommodation space of said computer mainframe and filled with a water cooling fluid for carrying thermal energy, said water cooling mechanism comprising:
   a water-cooling head having a bottom surface thereof attached to a top surface of a heating element of a circuit board;
   a water-cooling head adapter having a bottom side thereof attached to an opposing top surface of said water-cooling head and an opposing top side thereof provided with two water inlet and outlet connectors; and
   a steering adapter comprising two hard water pipes extended from one lateral side thereof and connected to a water cooling row connector of a water cooling row, and two flexible water pipes extended from a bottom side thereof and respectively connected to said water inlet and outlet connectors of said water-cooling head adapter, said two flexible water pipes being an adjustment structure that flexibly fits said steering adapter and said two water inlet and outlet connectors.

2. The adjustment structure for computer water cooling as claimed in claim 1, wherein said flexible water pipes refer to transparent or opaque hollow water pipes made of soft rubber.

3. The adjustment structure for computer water cooling as claimed in claim 1, wherein the angle between said two hard water pipes and said two flexible water pipes of said steering adapter is between 60° and 120°.

4. The adjustment structure for computer water cooling as claimed in claim 1, wherein the connection structure of said flexible water pipes and said water inlet and outlet connectors is selectively to positioned an outer pipe wall of each of said flexible water pipes on an side wall of a joining cavity inside the respective said water inlet and outlet connector or to attach an inner pipe wall of each said flexible water pipe onto an outer wall of the respective said water inlet and outlet connector.

5. The adjustment structure for computer water cooling as claimed in claim 1, wherein said hard water pipes refer to hollow water pipes made of glass or copper material.

6. The adjustment structure for computer water cooling as claimed in claim 1, wherein said water cooling fluid refers to a water cooling fluid with anti-corrosion and antibacterial properties.

7. The adjustment structure for computer water cooling as claimed in claim 1, wherein said heating element refers to the central processing unit, graphics processor, access device, interface card and power element.

* * * * *